(12) United States Patent
Hongo

(10) Patent No.: US 6,410,936 B1
(45) Date of Patent: Jun. 25, 2002

(54) SEMICONDUCTOR DEVICE

(75) Inventor: Katsunobu Hongo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/159,630

(22) Filed: Sep. 24, 1998

(30) Foreign Application Priority Data

Jun. 4, 1998 (JP) .......................................... 10-156378

(51) Int. Cl.$^7$ ................................................ H01L 23/58
(52) U.S. Cl. ........................... 257/48; 257/620; 438/14; 438/462; 324/763; 324/765
(58) Field of Search ...................... 257/48, 620; 438/14, 438/462; 324/763, 765; 365/201

(56) References Cited

U.S. PATENT DOCUMENTS

| | | | |
|---|---|---|---|
| 4,281,449 A | 8/1981 | Ports et al. .................... 324/52 |
| 5,294,776 A | 3/1994 | Furuyama ................... 219/209 |
| 5,619,462 A | 4/1997 | McClure ..................... 365/201 |
| 5,883,008 A | * 3/1999 | McClure ..................... 438/737 |

FOREIGN PATENT DOCUMENTS

| JP | 61-268034 | * 11/1986 |
|---|---|---|
| JP | 2000-124279 | * 4/2000 |

* cited by examiner

*Primary Examiner*—Minh Loan Tran
(74) *Attorney, Agent, or Firm*—Burns, Doane, Swecker & Mathis, LLP

(57) ABSTRACT

Each of semiconductor chips (1) formed on a wafer (190) has a power supply voltage leading wiring (6) connected to a power supply wiring (3), a BI mode detection circuit (20) connected to the power supply voltage leading wiring (6) for detecting the supply of the power supply voltage to the power supply wiring (3), a self oscillation circuit (40) for oscillating a clock signal during the BI mode, a timing generation circuit (50) for generating and outputting a timing clock during the BI mode, a BI mode control circuit (60) for transferring control signals to circuits (70) to be performed during the BI mode, and a power source circuit (10) for supplying the power supply voltage to circuits (40, 50, 60, and 70) during the BI mode.

18 Claims, 11 Drawing Sheets

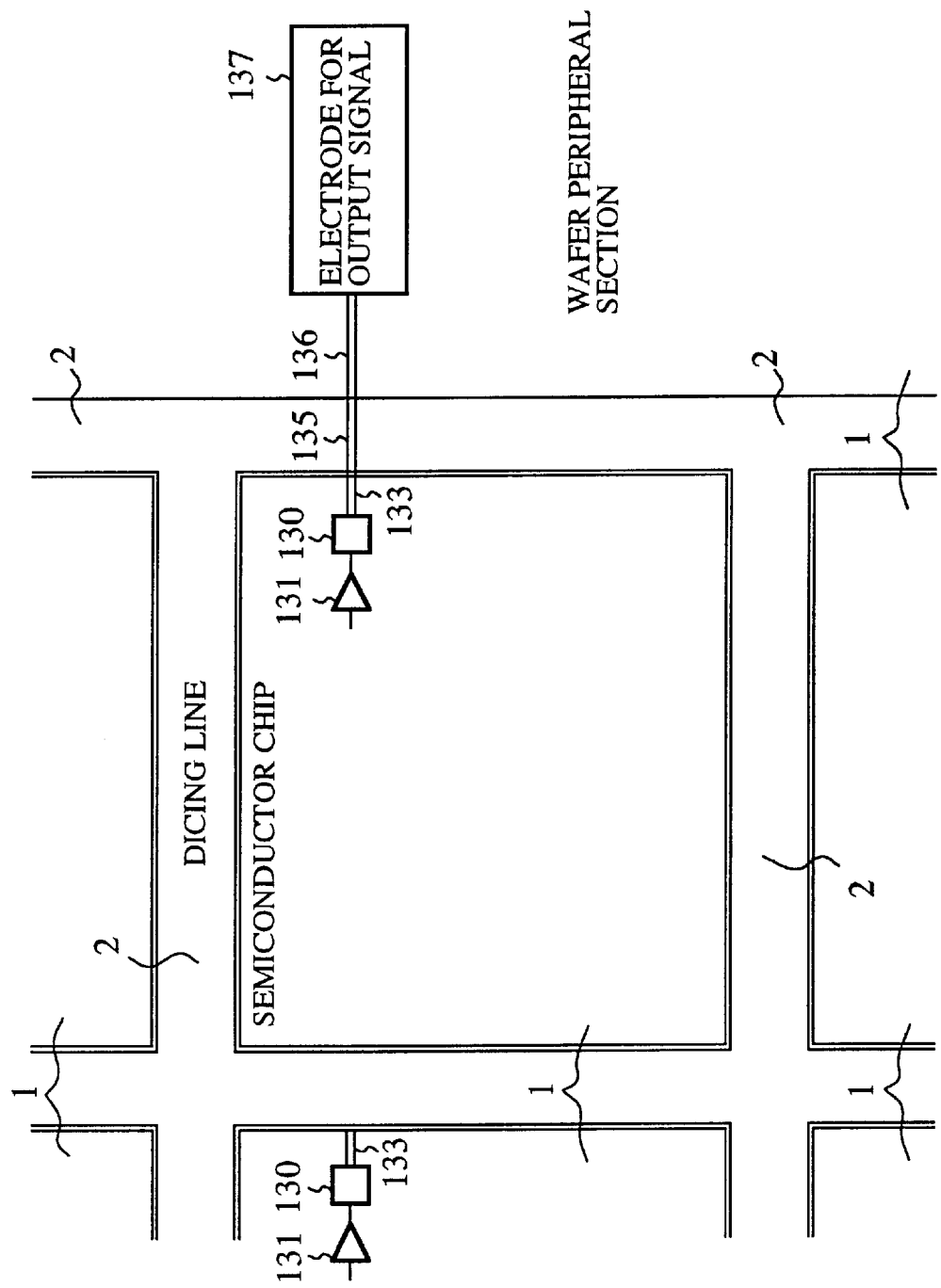

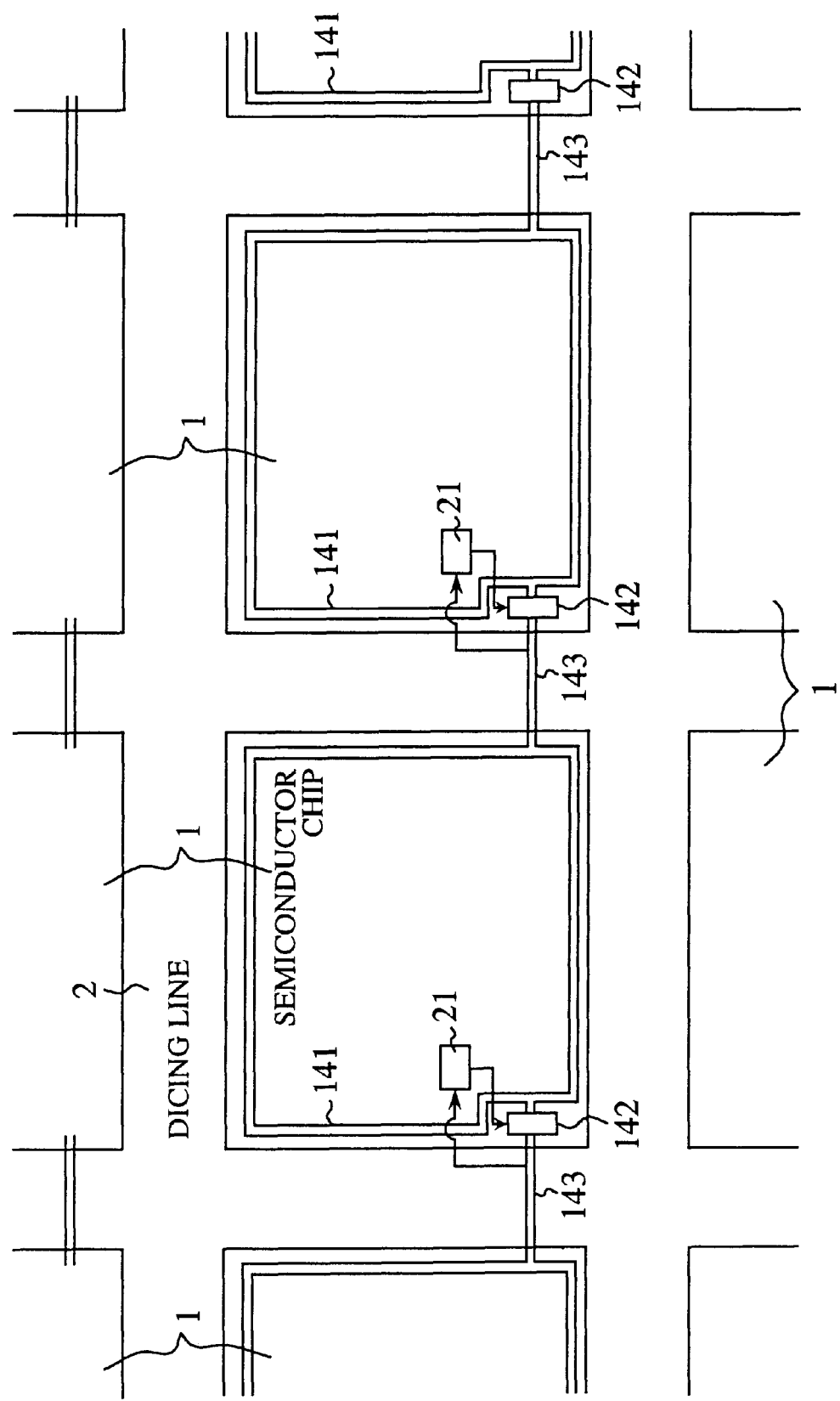

SEMICONDUCTOR DEVICE

BACKGROUND OF THE INVENTION

1. Field of the Invention

The present invention relates to a semiconductor device that may be burned in on a wafer level in a semiconductor fabrication process, a fabrication method thereof, and a wafer burn-in method.

2. Description of the Prior Art

In general, a burn-in process is performed for semiconductor products in fabrication processes. During the burn-in process, the semiconductor products operate under a circumstance at a high temperature in order to eliminate defective semiconductor products in advance before shipping. It is thereby possible to increase the reliability of those semiconductor products. However, in the past, the burn-in process may be performed only after a molding process for each of a plurality of semiconductor chips obtained after a dicing process for a wafer on which the plurality of the semiconductor chips are formed. That is, there is a drawback in the past that it is difficult to perform the burn-in process in the wafer level or it is also difficult to perform the burn-in process for the state of semiconductor chips obtained after the dicing process. Furthermore, during the burn-in process, the semiconductor products obtained by the molding process must be connected to a plurality of sockets in a burn-in board. In addition, the semiconductor products are placed in a burn-in furnace and treated at a high temperature by supplying a high voltage in a continuous time period. Accordingly, it must be required to provide a plurality of sockets for the burn-in process of the semiconductor products. This causes to increase the cost of the burn-in board. Further, in general, because there is a limitation to the size of the burn-in furnace, the number of the semiconductor products to be treated simultaneously in the burn-in process is limited. Therefore the cost including the burn-in process becomes high and the time period required for the burn-in process is also long.

SUMMARY OF THE INVENTION

Accordingly, an object of the present invention is, with due consideration to the drawbacks of the conventional technique, to provide semiconductor devices formed on a wafer, a fabrication method thereof, and a burn-in method. In the present invention, the semiconductor device may be burned in a wafer level efficiently, and semiconductor products assembled by an assembling process may also be burned in efficiently.

In accordance with a preferred embodiment of the present invention, a semiconductor device comprises a plurality of semiconductor chips formed on a wafer divided by dicing lines, and at least one power supply wiring to supply a power supply voltage formed on each of said dicing lines. Each of said semiconductor chips comprises a power supply voltage leading wiring connected to said power supply wiring, a burn-in mode (BI mode) detection circuit connected to said power supply voltage leading wiring for detecting the supply of the power supply voltage to said power supply wiring, and for generating a control signal and a BI mode detection signal indicating to enter said BI mode when the supply of the power source voltage to said power supply wiring, a self oscillation circuit for oscillating a clock signal having a predetermined frequency during the BI mode based on receiving of a BI mode signal, indicating to enter an operation of a burn-in process, transferred from said BI mode detection circuit, a timing generation circuit for receiving said clock signal and for generating a timing clock signal during said BI mode, a BI mode control circuit for receiving said timing clock signal and for transferring internal control signals to a plurality of internal circuits, incorporated in said semiconductor chip, to be executed under said BI mode, and a power supply circuit connected to said power supply voltage leading wiring for supplying said power supply voltage though said power supply wiring into said oscillation circuit, said timing generation circuit, said BI mode control circuit, and said plurality of internal circuits based on said control signal transferred from said BI mode detection circuit.

The semiconductor device as another preferred embodiment of the present invention, further comprises a first electrode region through which said power supply voltage is supplied and a second electrode region through which a ground voltage is supplied, both the first electrode region and the second electrode region are formed at a peripheral section of said wafer, wherein said second electrode region is electrically connected to a P– substrate layer through a P+ diffusion layer, and a P– diffusion layer of a N channel transistor in each of said semiconductor chips is electrically connected to said P– substrate layer, and the number of said power supply wiring formed on said dicing line is one and said power supply wiring on said dicing line is connected to said first electrode region.

In the semiconductor device as another preferred embodiment of the present invention, each of said plurality of semiconductor chips further comprises an input line, connected to said power supply wiring formed on said dicing line, independently from said power supply voltage leading wiring, to supply said power supply voltage into said BI mode detection circuit, and wherein said power supply voltage is directly supplied from said power supply wiring to said power source circuit through said power supply voltage leading wiring.

In the semiconductor device as another preferred embodiment of the present invention, said power source circuit comprises a transistor that enters ON when receiving said control signal transferred from said BI mode detection circuit during said BI mode and enters OFF in a mode other than said BI mode, wherein and said power source circuit supplies said power supply voltage to said self oscillation circuit, said timing generation circuit, said BI mode control circuit, and said plurality of internal circuit based on said the ON/OFF operation of said transistor.

In the semiconductor device as another preferred embodiment of the present invention, said transistor in said power source circuit is a P channel transistor, wherein said control signal transferred from said BI mode detection circuit is inputted to a gate of said P channel transistor.

In the semiconductor device as another preferred embodiment of the present invention, said transistor in said power source circuit is a N channel transistor, and said input line for supplying said power supply voltage from said power supply wiring to said BI mode detection circuit is directly connected to a gate of said N channel transistor.

In the semiconductor device as another preferred embodiment of the present invention, said BI mode detection circuit comprises a bonding pad for a wafer test formed on a node on said input line, and wherein a reversed voltage, whose voltage level is reversed to a voltage level of said power supply voltage supplied to said power supply wiring, is supplied to said bonding pad during execution of said wafer test.

In the semiconductor device as another preferred embodiment of the present invention, said BI mode detection circuit comprises a bonding pad for a wafer test formed on a node on said input line, and a pull down resistance or a pull up resistance is connected to said node on said input line, wherein a reversed voltage, whose voltage level is reversed to a voltage level of said power supply voltage supplied to said power supply wiring, is supplied to said bonding pad after dicing of said wafer.

In the semiconductor device as another preferred embodiment of the present invention, said BI mode detection circuit comprises at least two bonding pads, first bonding pad and a second bonding pad, connected to nodes on said input line, wherein a pull down resistance is connected to one of said bonding pads, and voltages of different levels are supplied to both said first bonding pad and said second bonding pad in order to melt said a wiring on said input line between said first bonding pad and said second bonding pad in said BI mode detection circuit in a semiconductor chip as a defective semiconductor chip detected by said wafer test, and wherein non-BI mode signal is supplied to said self oscillation circuit, said timing generation circuit, and said BI mode detection circuit through said bonding pad connected to said pull down resistance.

In the semiconductor device as another preferred embodiment of the present invention, each of said plurality of semiconductor chips further comprises a bonding pad formed on the way of a signal line connected between said BI mode detection circuit and said gate of said transistor in said power source circuit.

In the semiconductor device as another preferred embodiment of the present invention, each of said plurality of semiconductor chips further comprises a bonding pad for receiving a control signal, and a NOR circuit or a NAND circuit as an input gate formed in said BI mode detection circuit for inputting said BI mode signal to be transferred to said self oscillation circuit, said timing clock generation circuit and said BI mode control circuit, and wherein said input gate performs a logical operation between said BI mode control signal and said control signal transferred through said bonding pad during said BI mode in order to enter said input gate to an OFF state.

The semiconductor device as another preferred embodiment of the present invention, further comprises a bonding pad connected to a signal wiring, through which an output signal from each of said plurality of semiconductor chips is transferred, formed between a peripheral section of said wafer and each of said plurality of semiconductor chips, and wherein said output signal from each of said plurality of semiconductor chips is transferred to external device of said wafer through said signal wiring during said BI mode.

In the semiconductor device as another preferred embodiment of the present invention, said power supply wiring is formed so that said power supply wiring crosses said dicing line.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 11 is a diagram showing a detailed configuration of a plurality of semiconductor chips formed on a wafer as the seventh embodiment according to the present invention; and FIG. 12 is a diagram showing a detailed configuration of a plurality of semiconductor chips formed on a wafer as the eighth embodiment according to the present invention.

DESCRIPTION OF THE PREFERRED EMBODIMENTS

Other features of this invention will become apparent through the following description of preferred embodiments that are given for illustration of the invention and are not intended to be limiting thereof.

Preferred embodiments of the semiconductor device as the wafer, the fabrication process thereof, and the wafer burn-in method according to the present invention will now be described with reference to the attached drawings.

First Embodiment

Figure 1:
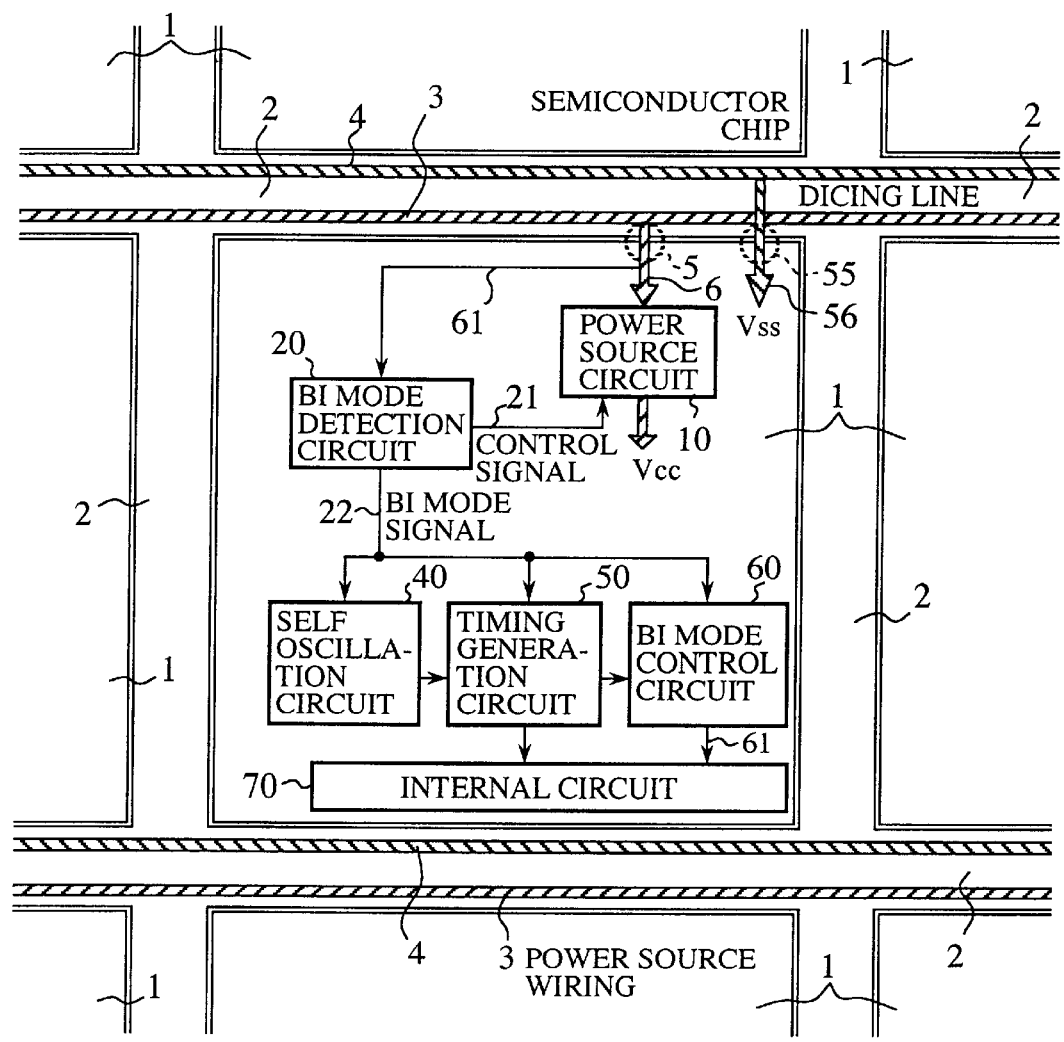
FIG. 1 is a diagram showing a configuration of a plurality of semiconductor chips formed on a wafer as a semiconductor device according to the first embodiment according to the present invention.

FIG. 1 is a diagram showing the configuration of a plurality of semiconductor chips formed on a wafer as a semiconductor device according to the first embodiment of the present invention. In FIG. 1, the reference number 1 designates a die or a semiconductor chip (or IC chip) such as a microcomputer, a memory such as a dynamic RAM, a ROM, and the like. In general, a plurality of semiconductor chips 1 are formed on a wafer. The reference number 2 denotes dicing lines through which a plurality of semiconductor chips 1 formed on the wafer are separated physically to each other. The reference numbers 3 and 4 indicate power supply wiring layers formed by a first aluminum layer, a second aluminum layer, and a GND wiring connected to a ground source. The reference number 10 designates a power source circuit formed in each of the semiconductor chips 1, and the reference number 6 denotes a power supply voltage leading wiring formed between the power supply wiring layer 3 through which the voltage Vcc is supplied and the power source circuit 10. The reference number 5 designates an input section of the power supply voltage leading wiring 6. The reference number 56 denotes a GND wiring through which the GND wiring 4 formed on the dicing line 2 and the GND wiring to supply the voltage Vss in the semiconductor chip 1 are connected, and the reference number 55 indicates a leading section for the voltage Vss connected to the GND wiring 56. The reference number 20 designates a burn-in mode (BI mode) detection circuit, and 40 denotes a self oscillation circuit for oscillating a clock signal during the BI mode. The reference number 50 indicates a timing generation circuit for generating an operation timing clock for various circuits in the semiconductor chip 1 and for outputting it. The reference number 60 designates a BI mode control circuit for generating an internal control signal and for outputting the internal control signals to the internal circuit 70 in order to control the operation of the internal circuit 70 during the BI mode, and 61 designates a control signal line connected between the BI mode control circuit and the internal circuit 70. The reference number 22 designates a BI mode signal provided from the BI mode detection circuit 20, and the reference number 21 indicates a control signal to be transferred from the BI mode detection circuit to the power source circuit 10. This control signal 21 controls the operation of the power source circuit 10. The internal circuit 70 is a circuit, to be performed during the BI mode, such as a central processing unit (CPU), a peripheral device, a memory, and so on.

Figure 2:
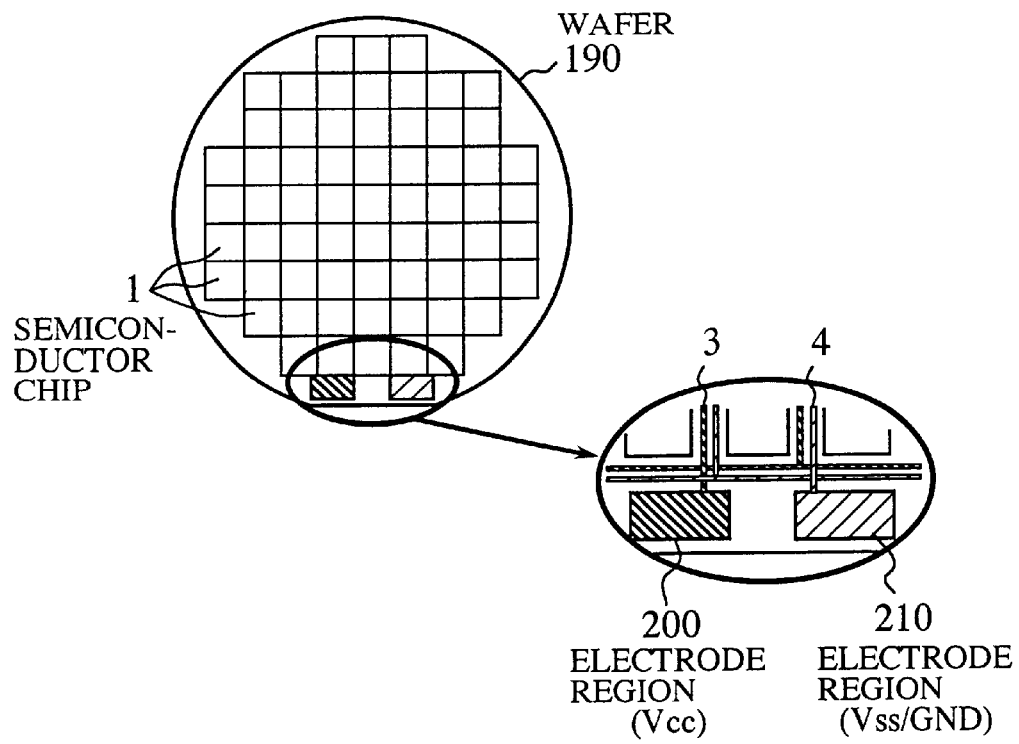
FIG. 2 is a diagram showing a configuration of electrode regions in the wafer according to the present invention.

FIG. 2 is a diagram showing the configuration of electrode regions for supplying a power supply voltage Vss and the ground voltage GND in various sections in the wafer such as the semiconductor chip 1 shown in FIG. 1 according to the present invention. In FIG. 2, the reference number 190 designates the wafer on which a plurality of the semiconductor chips 1 are formed. The reference number 200 denotes an electrode region, formed at a peripheral section of the wafer 190, made up of a conductive layer connected to the power supply wiring 3. The reference number 210 designates an electrode region, formed at a peripheral section of the wafer 190, made up of a conductive layer connected to the GND wiring 4.

Figure 3:
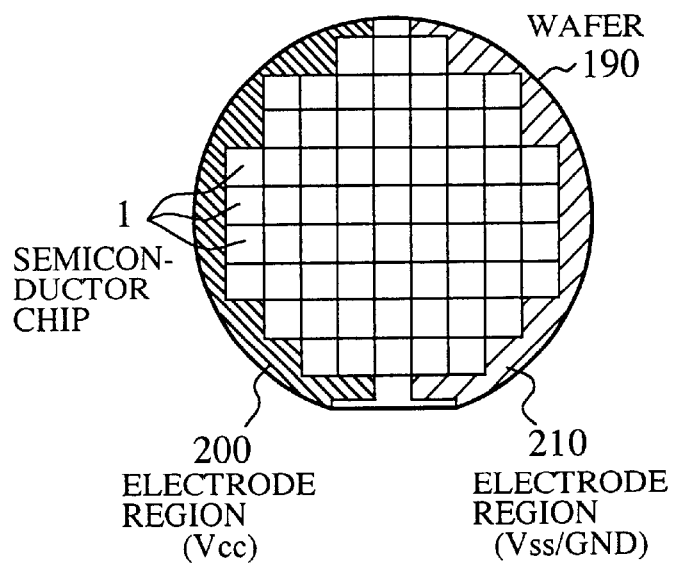
FIG. 3 is a diagram showing another configuration of electrode regions in the wafer according to the present invention.

FIG. 3 is a diagram showing another configuration of the electrodes 200 and 210 regions in the wafer 190 according to the present invention. In FIG. 3, the electrode regions 200 and 210 are enlarged in area in the peripheral region of the wafer 190. Like the configuration of FIG. 2, the electrode regions 200 and 210 are connected to the power supply wiring 3 and the GND wiring 4 (omitted from FIGS. 2 and 3), respectively.

Next, a description will be given of the operation of the semiconductor chip 1 formed in the wafer 190 as the first embodiment according to the present invention.

During the burn-in process, for example, the BI voltage of approximately 6.5 Volts (Vcc) and the GND (Vss) voltage are supplied to the electrode regions 200 and 210 at the peripheral region of the wafer 190, respectively. The applied voltages Vss and Vcc are also supplied to each of the semiconductor chips 1 through the power supply wiring 3 and the GND wiring 4 formed on the dicing line 2.

The BI mode detection circuit 20 detects the supply of the BI voltage to the power supply wiring 3, and then outputs the BI mode signal 22 of a High voltage level (a H voltage level) to each of the circuits 40, 50, and 60, and further outputs the control signal 21 of the H voltage level. The power supply circuit 10 initiates to supply the power supply voltage Vcc to the various circuits 40, 50, 60, and 70, and other circuits in the semiconductor chip 1 when the control signal 21 becomes the H voltage level. Thereby, the operation of each of the circuits 40, 50, 60, and 70 in the semiconductor chip 1 is initiated.

When the BI mode signal is the H voltage level, the self oscillation circuit 40 starts the oscillation of the clock signal, and then provides the clock signal to the timing generation circuit 50. It is also acceptable for the self oscillation circuit 40 to oscillate the clock signal instead of the level of the voltage of the BI mode signal 22, namely, it is possible for the self oscillation circuit 40 to generate the clock signal at all times, or it is also acceptable for the self oscillation circuit 40 to switch the frequency of the oscillated clock signal in the BI mode and the normal operation mode.

On the other hand, the timing generation circuit 50 inputs the clock signal from the self oscillation circuit 40 during the BI mode, generates the timing clock signal to be used for the operation of various circuits 60 and 70 under the BI mode based on the clock signal received, and then outputs the timing clock signal for the operation of the BI mode or both the timing clock signal and the received clock signal to the BI mode control circuit 60 and the internal circuit 70.

The BI mode control circuit 60 outputs the control signal in order to operate the internal circuit 70 through the control signal wiring 64 during the BI mode. The internal circuit 70 inputs the control signal through the control signal wiring 61 and operates during the BI mode by using the timing clock signal for the BI mode supplied from the timing generation circuit 50.

Next, a description will be given of the case in which the above operation under the BI mode is applied to a microcomputer.

The timing generation circuit 50 selects the clock signal from the self oscillation circuit 40 instead of the output clock signal from a normal oscillator (not shown) to be used for the normal operation, and then generates the timing clock signal. It is acceptable to use the output clock signal from the normal oscillator instead of the self oscillation circuit 40. In addition, the generation method of the timing clock may be same or different between the normal operation mode and the BI mode.

The BI mode control circuit 60 counts the clock signal and outputs a reset signal to the internal circuit 70 periodically based on the counted value. The BI mode control circuit 60 then outputs a control signal C to the internal circuit 70 in order to switch an address indicated by a reset vector addressing a field in a memory (from which the CPU will execute initially after the release of the reset) to an address addressing a field to store a BI mode program. An interrupt circuit (not shown) incorporated in the internal circuit 70 switches the address indicated by the reset vector to the address for the BI mode program that runs during the burn-in. Thereby, the CPU (not shown) performs the BI mode program every releasing of the reset occurred periodically.

The BI mode program controls so that the level of the voltage at each node in all of the circuits formed in the semiconductor chip 1 is switched to the H voltage level, a row voltage level (a L voltage level), the H voltage level, the L voltage level, . . . , periodically. One concrete example, a timer (not shown) counts the clock signal. In addition, an analogue/digital (A/D) converter (not shown) performs the A/D conversion operation repeatedly. For various types of memories such as a DRAM, a SRAM, a EPROM, a flash memory, and so on, a sequencer (not shown) for periodically accessing (namely, reading and writing data) all of the memory elements in the above memory is incorporated in the BI mode control circuit 60, for example. Thereby, during the BI mode, the sequencer (not shown) in the BI mode control circuit 60 is performed by using the clock signals from the self oscillation circuit 40 and the timing generation circuit 50 in order to sequentially access all of the memory elements in the memory.

As described above, according to the first embodiment, because each of the semiconductor chip 1 formed on the wafer 190 has the power source circuit 10, the BI mode detection circuit 20, the self oscillation circuit 40, the timing generation circuit 50, and the BI mode control circuit 60, it is possible to supply power supply voltages to all of the semiconductor chips 1 formed on the wafer 190 and to perform the operation under the BI mode only by electrically connecting the electrode regions 200 and 210 formed on the wafer 190 to the power source and the ground power source GND. That is, the wafer 190 may be burned in on a wafer level.

Second Embodiment

Figure 4:
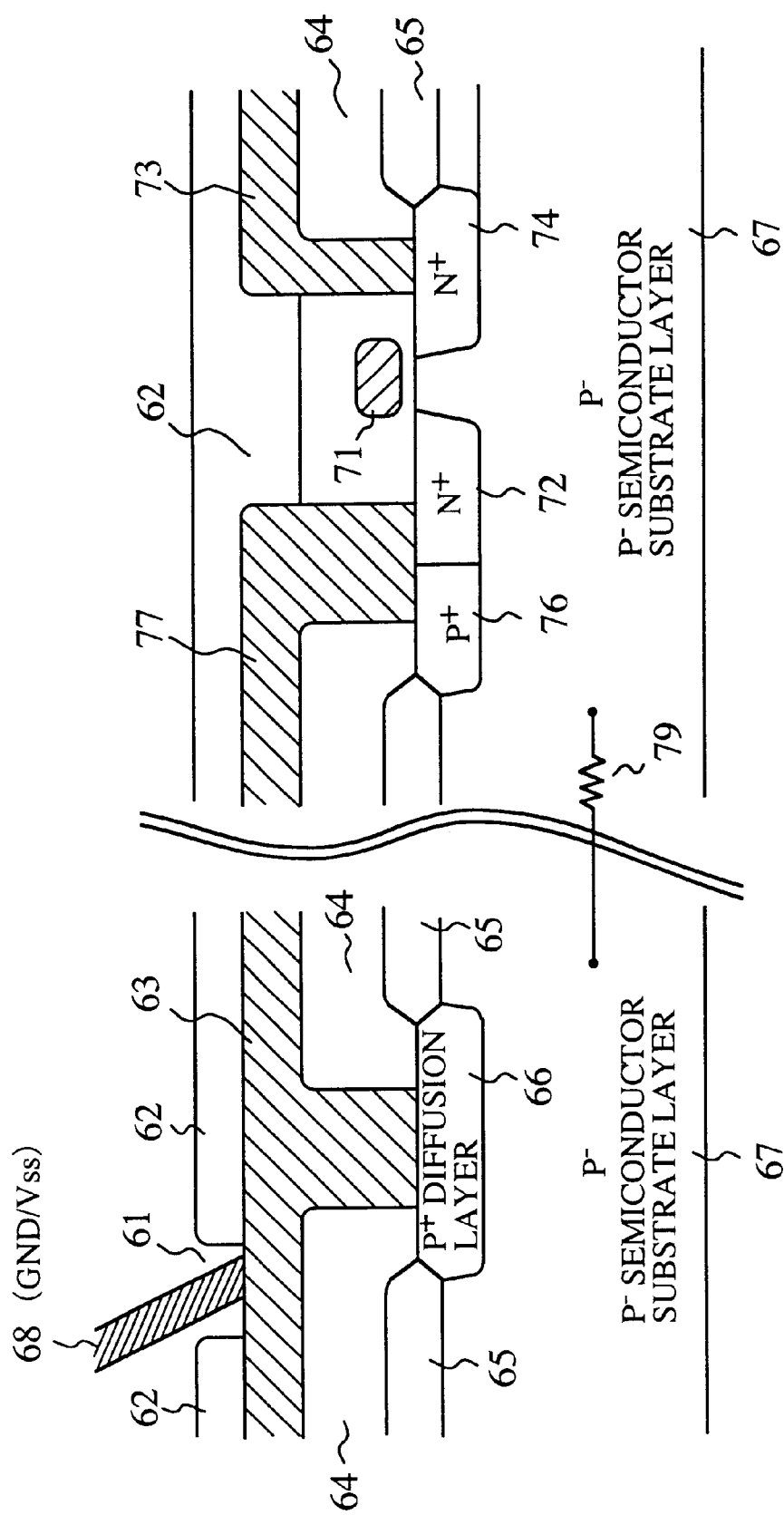
FIG. 4 is a sectional diagram of an electrode region and a semiconductor chip formed on a wafer as the second embodiment according to the present invention.

FIG. 4 is a sectional diagram of electrode regions and a semiconductor chip formed on a wafer as the second embodiment according to the present invention. In FIG. 4, the left part shows the sectional view of the electrode region 210 in the wafer and the right part shows a N channel transistor (hereinafter referred to as N channel Tr) formed in a semiconductor chip 1 formed on the wafer. In FIG. 4, the reference number 67 designates a P-type semiconductor substrate (P-substrate layer), the reference numbers 66 and 76 indicate P+ diffusion layers, the reference numbers 63, 73, and 77 denote aluminum layers, and the reference numbers 62, 64, and 65 indicate $SiO_2$ insulating layers, for example. The reference number 71 designates a gate electrode layer of the N channel Tr, the reference numbers 72 and 74 denote N+ diffusion layers, namely, a source layer and a gate layer, respectively. The reference number 68 indicates a metal electrode in a burn-in apparatus (not shown) through which the level of the GND voltage is supplied to various circuits in each of the semiconductor chip formed on the wafer 190 because the metal electrode 68 is electrically connected to the aluminum layer as the electrode region 210 in the wafer 190.

Figure 5:
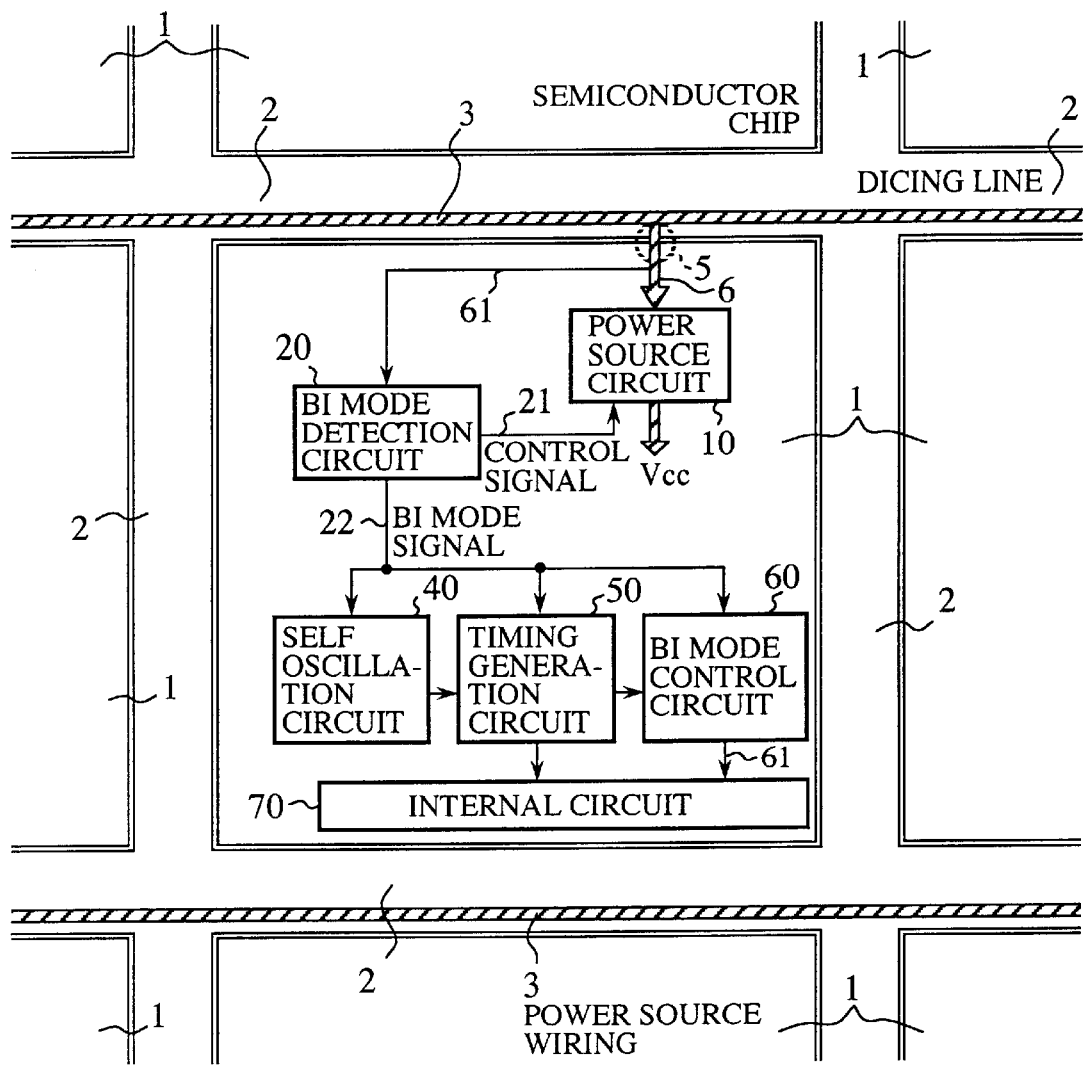
FIG. 5 is a diagram showing a configuration of a plurality of semiconductor chips formed on a wafer as the second embodiment according to the present invention.

FIG. 5 is a diagram showing the configuration of the plurality of the semiconductor chips 1 formed on the wafer 190 shown in FIG. 4 as the second embodiment according to the present invention. The same reference numbers are used for the same elements in the semiconductor chip 1 as the first and second embodiments shown in FIG. 1 to 5. Therefore the explanation of the same circuit elements is omitted here for brevity.

Next, a description will be given of the operation of the semiconductor chip shown in FIGS. 4 and 5.

Each of the aluminum layers in the N channel transistors 73 and 77 is a source wiring (Vss/GND) and a drain wiring, respectively. The reference number 79 indicates an internal resistance.

Even if the aluminum layer 63 as the electrode region 210 at the peripheral section of the wafer is connected to the aluminum layer 77 as the source wiring of the N channel Tr in the semiconductor chip 1, the GND voltage of the aluminum layer 63 is electrically connected to the p-substrate layer 67. Thereby the GND voltage is supplied to the P– diffusion layer of the N channel Tr through the P-substrate layer 67.

Because the P+ diffusion layer 76 is electrically connected to the N+ diffusion layer 72 through the aluminum layer 77, the electrode region 210 is connected to the source region of the N+ diffusion layer 72. Accordingly, the GND wiring 4 formed on the dicing lien 2 may be eliminated by forming the P+ diffusion layer 66, like the configuration shown in the left section of FIG. 4.

As shown in FIG. 5, because it is not required that the GND wiring 4 is formed on the dicing line 2 in the wafer according to the second embodiment. Accordingly, when comparing with the configuration of the wafer as the first embodiment, the wafer of the second embodiment has a simple configuration As described above, according to the second embodiment, the wafer has the simple configuration in which the P+ diffusion layer is formed under the aluminum layer 63 as the sectional configuration of the electrode region 210, and the aluminum layer 63 is electrically connected to the source layer of the N channel Tr formed in the semiconductor chip 1 through the P– substrate layer 67. Thereby, it is not required to form the GND wiring 4 on any dicing line 2. This causes to reduce the width or the area of the dicing lines 3, and so that it is possible to increase the number of semiconductor chips formed on a wafer. That is, it is possible to use the area of a wafer efficiently.

Third Embodiment

In the first and second embodiments have been described above, the configuration of the semiconductor chip 1, the dicing line 2, the power supply wiring 3, and the GND wiring 4 have been explained. In this third embodiment, detailed configuration of each circuit elements in the semiconductor chip 1 will be explained.

Figure 6:
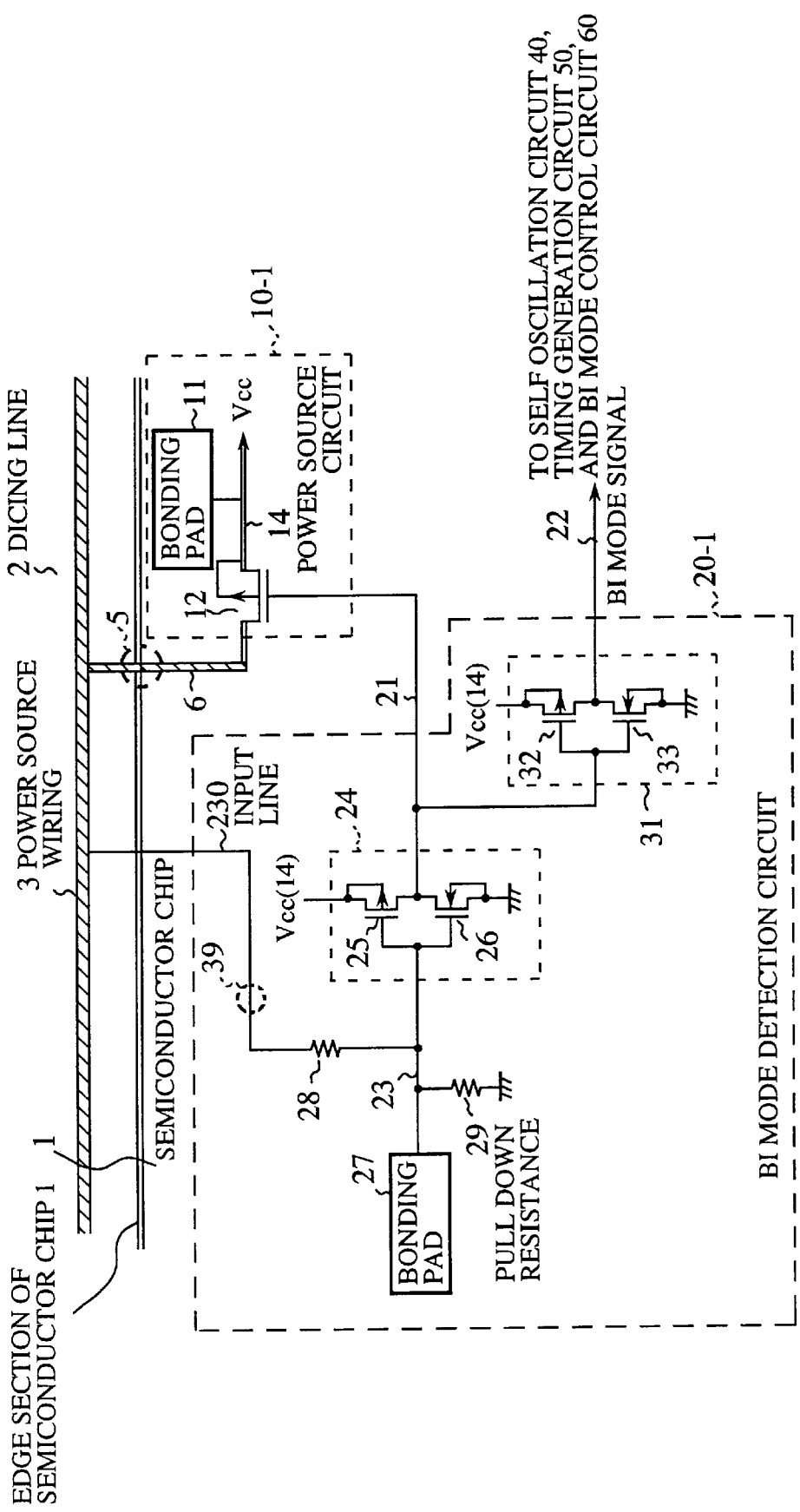
FIG. 6 is a diagram showing a detailed configuration of a semiconductor chip formed on a wafer as the third embodiment according to the present invention.

FIG. 6 is a diagram showing the detailed configuration of the semiconductor chip 1 formed on the wafer as the third embodiment according to the present invention. In FIG. 6, the reference number 10-1 designates a power source circuit, 11 denotes a bonding pad that will be wired to the power source Vcc during an assembling process for semiconductor products. The reference number 12 designates a P channel transistor (hereinafter referred to as a P channel Tr) capable of performing and halting the supply of the voltage of the power source. The reference number 14 denotes a power supply wiring, formed in the semiconductor chip 1, to supply the power supply voltage Vcc. Thus, the power source circuit 10-1 comprises the bonding pad 11, the P channel Tr 12, and the power supply wiring 14.

The reference number 20-1 designates the burn-in mode (the BI mode) detection circuit, 27 denotes a bonding pad through which the voltage is supplied to the BI mode detection circuit 20-1 during a wafer testing process. The reference number 28 indicates a resistance formed on the input line 230. The reference number 29 is a pull down resistance to pull down the voltage at a node 23. The reference numbers 24 and 31 denote inverter circuits. Thus, the BI mode detection circuit comprises the bonding pad 27, the resistance 28, the pull down resistance 29, and the inverter circuits 24 and 31.

In addition, the inverter circuit 24 comprises the P channel Tr 25 and the N channel Tr 26. The inverter circuit 31 comprises the P channel Tr 32 and the N channel Tr 33. The output of the inverter circuit 33 becomes the BI mode signal 22 informing to enter the BI mode and the output of the inverter circuit 24 becomes the control signal, that is transferred to the power source circuit 10-1, indicating to supply the power supply voltage. In the explanation of the third embodiment, the same reference numbers are used for the same circuit elements in the semiconductor chip 1 between the second and third embodiments, therefore the explanation of them is omitted here for brevity.

Next, a description will be given of the operation of the semiconductor chip 1 as the third embodiment.

(1) Operation of a Burn-in Mode

During the BI mode, the power supply voltage is supplied to the power supply wiring 3, the power supply voltage leading wiring. 6 and the input line 230, and the bonding pads are connected to no elements, namely, the bonding pads 11 and 27 are under an open state. The power supply voltage is supplied to the node 23 of the bonding pad 27 through the resistance 28 and the input line 230. Because it is so formed that the value of the resistance 28 is smaller than the value of the pull down resistance 29 (R28<<R29), the voltage potential at the node 23 is approximately equal to the power source voltage, namely approximately equal to the H voltage level. Accordingly, the control signal 21 as the output of the inverter circuit 24 becomes the L voltage level, and the output of the inverter circuit 31 becomes the H voltage level (BI mode).

Because the control signal 21 from the inverter circuit 24 in the BI mode detection circuit 20-1 becomes the H voltage level, the P channel Tr 12 in the power source circuit 10-1 turns ON, so that the voltage Vcc of the power supply voltage leading wiring 6 is supplied to the node connected to the power supply wiring 14 of the power supply voltage Vcc through the P channel Tr 12, and therefore the power supply voltage Vcc is also supplied to the various circuit elements incorporated in the semiconductor chip 1. As has been explained in the first embodiment, because the level of the BI mode signal becomes the H voltage level and the power supply voltage Vcc is supplied to the semiconductor chip 1, each of the circuits formed in the semiconductor chip 1 operates under the BI mode.

(2) Operation of a Wafer Test Process

During a wafer test process, probes of a tester (omitted from the diagram) are electrically contacted to the bonding pads 11 and 27 in order to supply the power supply voltage Vcc and the low voltage in the semiconductor chip 1. Because the electrode region 210 formed at the peripheral section in the wafer 190 enters the open state, the power supply wiring 3 and the power supply voltage leading wiring 6 also enter the open state. However, because the voltage of the L level is supplied to the bonding pad 27 connected to the resistance 28, the voltage level of the power supply wiring 3 and the power supply voltage leading wiring 6 become the L voltage level, namely the GND level. Because the L voltage is supplied to the bonding pad 27, the output of the inverter circuit 24 becomes the H voltage level, and the output of the inverter circuit 31 becomes the level of non-BI mode. Because the control signal 21 becomes the H voltage level, the P channel Tr enters the OFF state, so that the power supply voltage is directly supplied to the power supply wiring 14 of the voltage Vcc through the bonding pad 11. Further, because the BI mode signal 22 becomes the L voltage level and the power supply voltage is also supplied to the semiconductor chip 1, each of the circuits in the semiconductor chip 1 operates under the normal operation mode. Specifically, sometimes it happens that noises are directly transferred from the power supply wiring 3 under the open state (to which no device is connected) during the wafer test operation to the BI mode detection circuit 20-1. This causes error operation and to destroy the semiconductor chip. In order to avoid this drawback, it is required to incorporate the resistance 28 on the node 23 in the BI mode detection circuit 20-1 in each of the semiconductor chip 1.

(3) Operation After an Assembling Process

Firstly, the wafer 190 is physically cut through the dicing lines 2 in order to separate and obtain a plurality of the semiconductor chips 1 during the assembling process for the semiconductor chips 1 to make semiconductor products. After the cutting process for the dicing lines 2, each of the semiconductor chips is molded (or fixed by using solder) on a die pad in a frame. Leads in the frame are electrically connected (namely, wire-bonded) to the bonding pads of the semiconductor chip 1 through gold wiring or aluminum wiring. After the cutting process of the dicing lines 2, the power supply wiring 3 is eliminated and the power supply voltage leading wiring 6 is cut at the upper leading section 5. In the wiring bonding process, the bonding pad 11 is electrically connected to the terminal of the supply voltage Vcc and the bonding pad Vss is electrically connected to the terminal of the GND voltage Vss in the assembling product (not shown).

During the operation of the assembled semiconductor product, the power supply voltage Vcc and the GND voltage Vss are supplied through the bonding pad 11 for the voltage Vcc and the bonding pad for the GND voltage Vss, respectively. In addition to this, because the bonding pad 27 enters the open state (to which no device is connected) and the power supply voltage leading wiring 6 has been cut, the voltage potential of the bonding pad 27 is led to the L voltage level by the pull down resistance 29 when the P channel Tr 12 is in the OFF state. Accordingly, the level of the control signal 21 as the output of the inverter circuit 24 becomes the H voltage level, the P channel Tr 12 in the power source circuit 10-1 enters the OFF state. The level of the BI mode signal 22 as the output of the inverter circuit 33 becomes the L voltage level, so that each of the circuits in the semiconductor chip 1 operates in the normal operation mode.

As described above, when the power source circuit 10-1 and the BI mode detection circuit 20-1 have the configuration shown in FIG. 6, the BI mode detection circuit 20-1 may detect that the semiconductor chip 1 enters the BI mode, so that it is possible to perform the semiconductor chip 1 under the BI mode. In the configuration of each of the semiconductor chips 1 as the second embodiment, it is further possible to avoid error operation in which the semiconductor chip 1 operates in the BI mode during the wafer test process or after the assembling process, because the power supply voltage leading wiring 6 has been cut, so that no BI mode is established during the wafer test process or after the assembling process.

Furthermore, because the P channel Tr 12 enters the OFF state after the assembling process, it is possible to prevent the flowing of the leak current from the power supply wiring 14 into each circuit in the semiconductor chip 1 even if the leak of current occurs at the cut surface of the power supply voltage leading wiring 6.

Moreover, in the wafer test process performed before the burn-in process in a wafer level, when there is a defective section in the semiconductor chip, in particular, when there is a defective semiconductor chip in which an electrical short occurs between the power supply wiring layers of the voltages Vss-Vcc, the section in the input line 230 designated by the reference number 39 is melted by using a laser beam. It is thereby possible to pull down the voltage potential of the node 23 in the burn-in process in the wafer level and to halt the operation of the P channel Tr 12. Thus, it is also possible to perform the burn-in process of the wafer 190 according to the third embodiment in the wafer level.

Moreover, in the configuration of the semiconductor chip 1 in the wafer 190 shown in FIG. 6, the pull down resistance 29 is incorporated and no wire bonding is performed for the bonding pad 27 during the assembling process. In this case, it is thereby possible to reduce the fabrication cost of the wire bonding process because no bonding wire for the bonding pad 27 is used.

Further, it is acceptable to form no pull down resistance 29 and the node 23 is directly connected to the lead of the power supply voltage Vss by the wire bonding process during the assembling process in order to set the level of the node 23 to the L voltage level. Thereby, it is possible to avoid the execution under the BI mode because the level of the node 23 may keep the L voltage level, the level of the control signal 21 becomes the H voltage level, and the P channel Tr may be set to the OFF state even if the P channel Tr does not enter the OFF state when the electricity supply is switched ON.

In the wafer 190 according to each of the first and second embodiments having the configuration shown in FIG. 1 and FIG. 4, a line 61 to supply the voltage is connected to the BI mode detection circuit 20. This line 61 is a branch wiring of the power supply voltage leading wiring 6. Assembled semiconductor products having this configuration makes a chance to establish or to execute the BI mode process when the electricity supply is switched ON. In order to avoid the execution of the BI mode process when the electricity supply is switched ON after the assembling process. On the other hand, the wafer according to the third embodiment, as shown in FIG. 6, the voltage is directly supplied to the BI mode detection circuit 20-1 through the input line 230 connected to the power supply wiring 3 formed on the dicing line 2. Therefore the input line 230 connected to the BI mode detection circuit 20-1 is certainly cut during the dicing cutting process, so that the voltage potential at the node 23 is certainly pulled down by the pull down resistance 29. Accordingly, the level of the control signal 21 becomes the H voltage level, the level of the BI mode signal 22 becomes the L voltage level. Thereby, even if the P channel Tr is not in the OFF state when the electricity supply is switched ON for the assembled semiconductor product, the level of the control signal 21 enters the OFF state certainly. Thereby, the power source circuit 10-1 does not enter the BI mode, and it may be prevented to supply the power supply voltage Vcc to the various circuits in the semiconductor chip 1 during any mode other than the BI mode.

In addition, in the configuration shown in FIG. 6, the bonding pad 27 is connected to the node 23, and the L voltage is supplied to the bonding pad 27 during the wafer testing process, and the state of the bonding pad 27 is open after the assembling process. It is also acceptable to have the configuration in which the bonding pad 27 is connected to the node through which the control signal 21 is transferred, the H voltage level is supplied to the bonding pad 27, and in the assembled semiconductor products, the bonding pad 27 is wired when the power supply voltage Vcc is led. This case has the same effect above.

Figure 7:
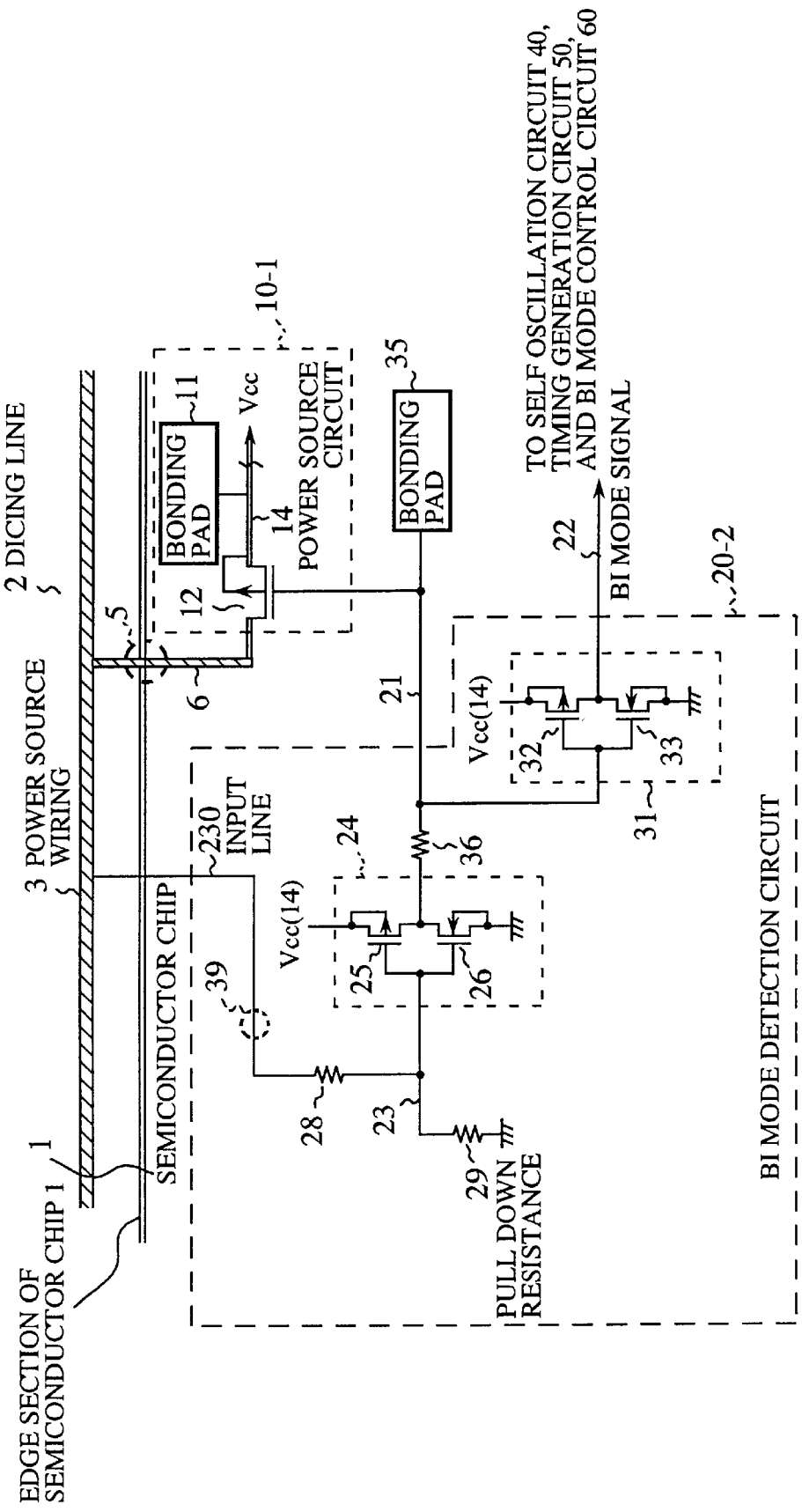
FIG. 7 is a diagram showing another detailed configuration of a semiconductor chip formed on a wafer as the third embodiment according to the present invention.

FIG. 7 is a circuit diagram showing another detailed configuration of the semiconductor chip 1 formed on the wafer as the third embodiment according to the present invention. In FIG. 7, the reference number 20-2 designates a BI mode detection circuit, and the reference number 35 denotes a bonding pad to which the power supply voltage Vcc is applied. Other components in the semiconductor chip 1 shown in FIG. 7 are the same of those of the semiconductor chip 1 formed on the wafer 190 shown in FIG. 6, therefore the same reference numbers are used for the same components and the explanation of them is omitted here for brevity.

In the semiconductor chip 1 having the configuration shown in FIG. 7, even if the P channel Tr 25 forming the inverter circuit 24 is a defective circuit and thereby the inverter circuit 24 can not set the control signal 21 to the H voltage level after the assembling process, because the power supply voltage Vcc is supplied to the bonding pad 35, the level of the control signal 21 becomes the H voltage level, the P channel Tr 12 enters the OFF state, and the level of the BI mode signal 22 enters the L voltage level. This may lead the circuits in the semiconductor chip 1 to the normal operation mode.

Thus, the semiconductor chip 1 having the configuration of the wafer 190 shown in FIG. 6 and FIG. 7 may operate correctly after the assembling process. That is, it is possible to cut the section 39 designated by the dotted circle in the defective semiconductor chip 1 having the configuration shown in FIG. 6 and FIG. 7 in order to halt the execution of the BI mode when the defective section is detected during the wafer test process. It is therefore possible to perform the burn-in process in the wafer level, like the wafers of the first embodiment and the second embodiment.

As described above, according to the third embodiment, the input line 230 in order to supply the power supply voltage from the power supply wiring 3 directly to the BI mode detection circuits 20-1 and 20-2 is formed and the bonding pad 11 is formed in the power source circuit 10-1, and the bonding pad 27 and the pull down resistance 29 are also formed in the BI mode detection circuit 20-1. In addition, the bonding pad 35 is formed, instead of the bonding pad 27, on the transmission line for the control signal 21 to be transferred from the BI mode detection circuit 20-2 to the power supply circuit 10-1 as another configuration of the BI mode detection circuit 20-1, Therefore, even if no BI mode is established or executed during the wafer test process and after the assembling process and it is possible to perform the normal operation process correctly without causing any error operation and it may be prevented to set the power source circuit 10-1 to the BI mode during the normal operation mode.

Fourth Embodiment

Figure 8:
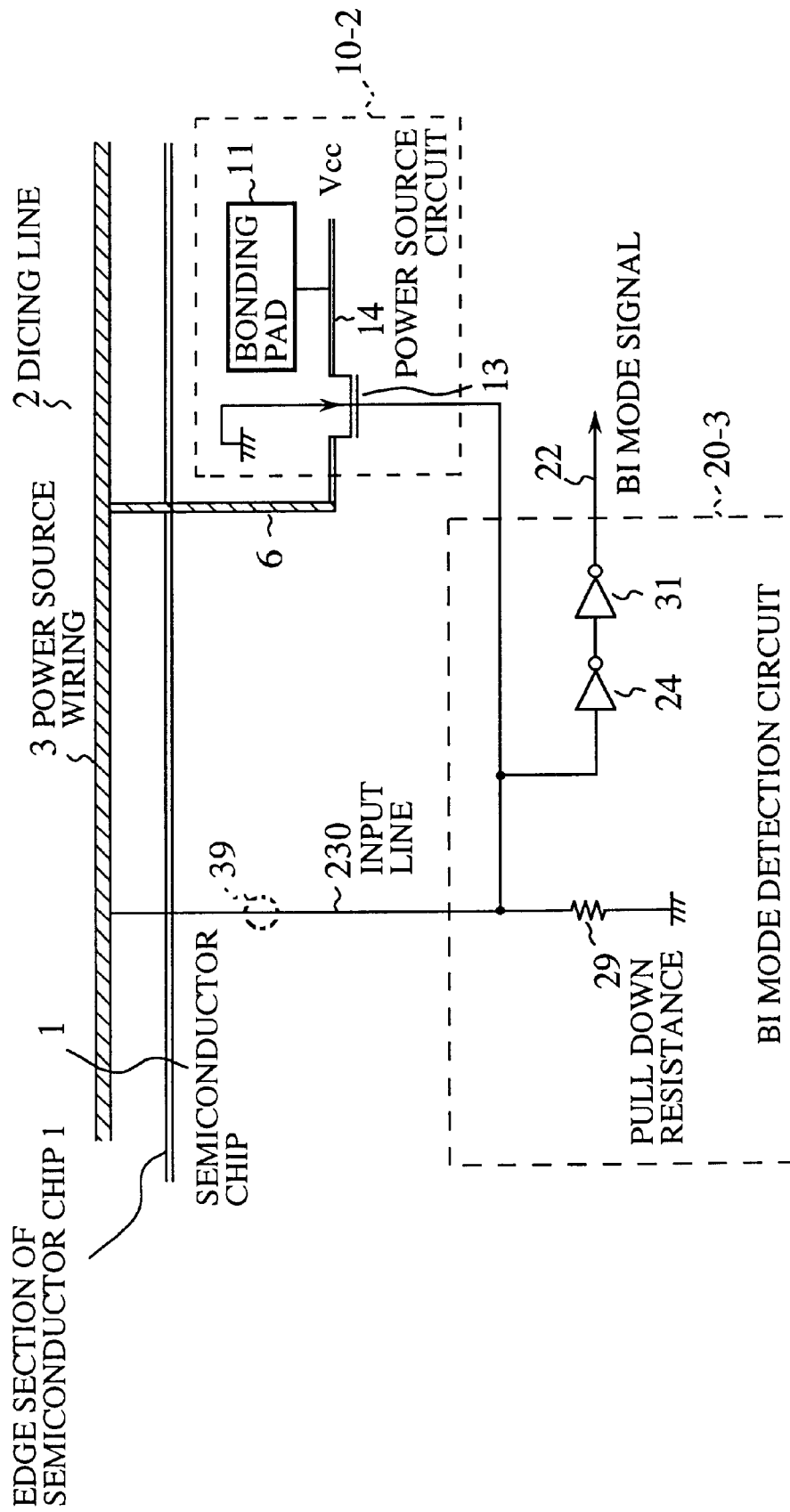
FIG. 8 is a diagram showing a detailed configuration of a semiconductor chip formed on a wafer as the fourth embodiment according to the present invention.

FIG. 8 is a diagram showing the detailed configuration of the semiconductor chip formed on the wafer as the fourth embodiment according to the present invention. In FIG. 8, the reference number 10-2 designates a power source circuit in the semiconductor chip 1, and 20-3 denotes the burn-in mode (the BI mode) detection circuit in the semiconductor chip 1. Other components in the semiconductor chip 1 of the fourth embodiment shown in FIG. 8 are the same of those of the semiconductor chip 1 formed on the wafer 190 as the first and third embodiments, therefore the same reference numbers are used for the same components and the explanation of them is omitted here for brevity.

Next, a description will be given of the operation of the semiconductor chip 1 as the fourth embodiment.

In the power source circuits 10, 10-1 in the semiconductor circuit 1 in the wafer 190 as each of the first to third embodiments, the P channel Tr 12 is used in order to supply the power supply voltage to each circuit in the semiconductor chip 1 during the BI mode, and it is prevented to supply the voltage supplied to the bonding pad 11 to the power supply voltage leading wiring 6 during the wafer test process and after the assembling process. On the contrary, in the power source circuit 10-2 in the semiconductor chip 1 of the fourth embodiment, the N channel Tr 13 is used instead of the P channel Tr 12. Therefore because the voltage to access the N channel Tr 13 is the reverse voltage to access the P channel Tr 12 in level, the gate of the N channel transistor 13 is directly connected to the power supply voltage leading wiring 6. During the BI mode, because the power supply voltage is supplied to the power supply wiring 3 and the input line 230, the N channel Tr 13 enters the ON state, so that the power supply voltage is supplied to each of the circuits in the semiconductor chip 1. On the contrary, during the wafer test process and after the assembling process, because the level of the input line 230 is pulled down by the pull down resistance 29, the N channel Tr 13 enters the OFF state.

Since the wafer of the fourth embodiment has the above configuration, the ON/OFF control signal for the N channel Tr 13 to be used for supplying the power supply voltage is transferred through the line directly connected to the input line 230 and the pull down resistance 29, not connected to the inverter circuit 24 shown in FIG. 6 and FIG. 7. Accordingly, even if the inverter circuit 24 becomes a defective circuit caused during the wafer fabrication process and it can not operate, it is possible to control the operation of the N channel Tr 13 incorporated in the power source circuit 10-2 in each of the semiconductor chips 1 formed on the wafer certainly.

As described above, according to the fourth embodiment, the N channel Tr 13 is formed in the power supply circuit 10-2 in each of the semiconductor chip 1 and the ON/OFF control signal for the N channel Tr 13 is transferred to the power source circuit 10-2 through the line directly connected to the input line 230 and the pull down resistance 29, not connected to the inverter circuit 24 in the BI mode detection circuit 20-1 of the third embodiment shown in FIG. 6. Accordingly, even if the inverter circuit 24 does not operate based on a defective circuit caused during the wafer fabrication process, it is possible to control the operation of the N channel Tr 13 incorporated in the power source circuit 10-2 in each of the semiconductor chips 1 formed on the wafer certainly.

Fifth Embodiment

The first to fourth embodiments have explained the cases in which the regions designated by the reference numbers 38 and 39 may be cut by using a laser beam in order to prevent to enter the semiconductor chip 1 into the burn-in mode (the BI mode) when the wafer test process detects the presence of a defective semiconductor product before the burn-in process, in particular, when the wafer test process detects the presence of a defective semiconductor product in which the electrical short occurs between the power supply voltages Vcc and Vss. However, when the defective semiconductor chip in which the electrical short occurs between the power supply voltages Vcc and Vss is burned in, the heavy load is applied to the power source circuits 10, 10-1, and 10-2. This causes to decrease the level of the power source voltage, so that the efficiency of the BI mode operation to be performed for other semiconductor chips 1 having any detect is reduced.

Figure 9:
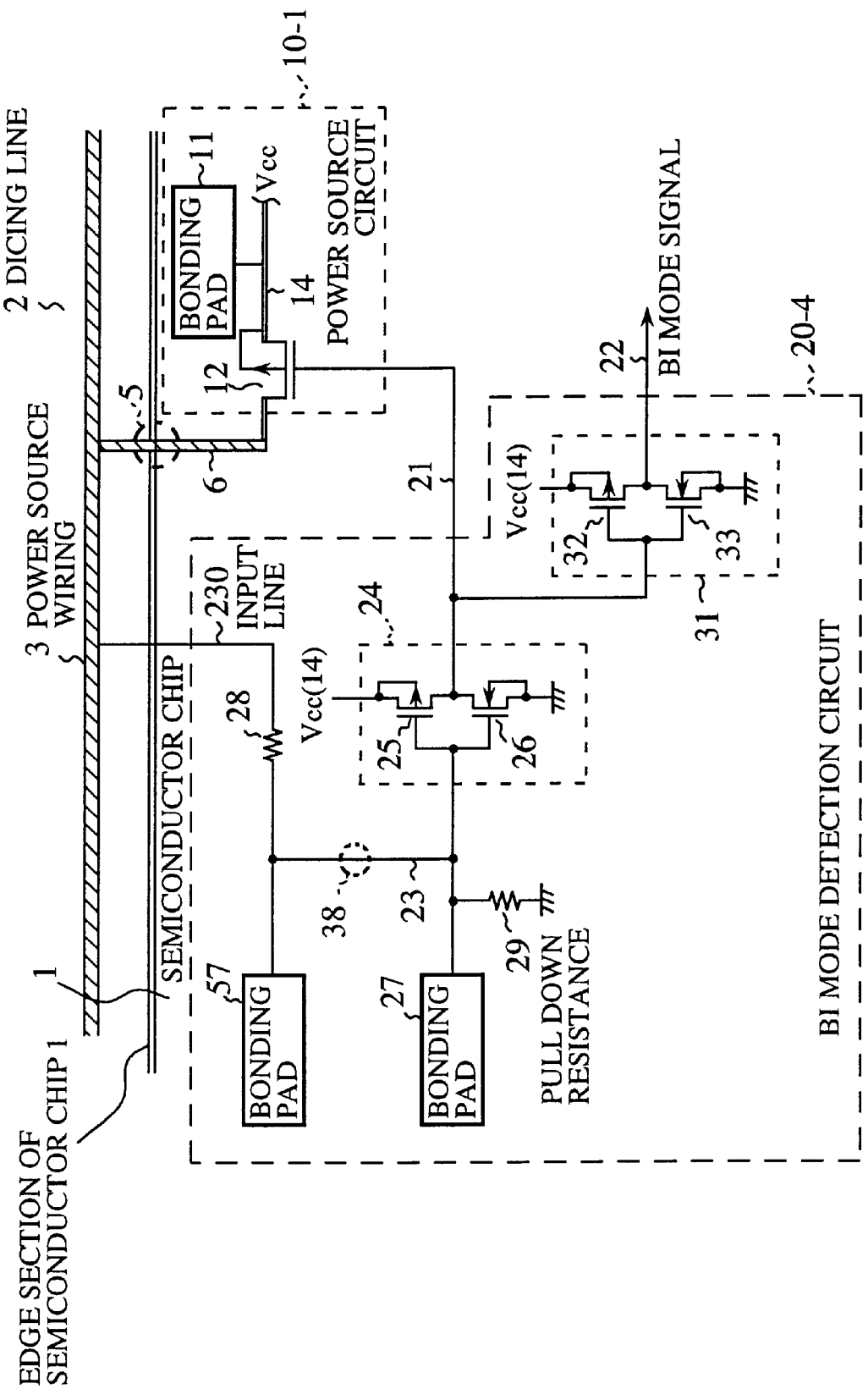
FIG. 9 is a diagram showing a detailed configuration of a semiconductor chip formed on a wafer as the fifth embodiment according to the present invention.

FIG. 9 is a diagram showing the detailed configuration of the semiconductor chip formed on the wafer as the fifth embodiment according to the present invention. In FIG. 9, the reference number 20-4 designates a BI mode detection circuit, and 57 denotes a bonding pad. Other components in the semiconductor chip 1 of the fifth embodiment shown in FIG. 9 are the same of those of the semiconductor chip 1 formed on the wafer 190 as the third embodiment, therefore the same reference numbers are used for the same components and the explanation of them is omitted here for brevity.

Next, a description will be given of the operation of the semiconductor chip 1 on the wafer as the fifth embodiment.

As shown in FIG. 9, in the BI mode detection circuit 20-4 in the semiconductor chip 1 formed on the wafer as the fifth embodiment, the bonding pad 57 is formed on the line of the input line 230. Accordingly, the two bonding pads 27 and 57 are formed in the BI mode detection circuit 20-4. The operation of the semiconductor product during the burn-in process in a wafer level, during the wafer test process, and after the assembling process is same between the third to fifth embodiments.

In the defective semiconductor chip detected during the wafer test process, the voltage of the H level is supplied to the bonding pad 27, the voltage of the L level is supplied to the bonding pad 57. Thereby, the region 38 on the node 23 is melted by Joule heat caused by a large current flow based on the above different voltages.

As described above, according to the fifth embodiment of the present invention, the two bonding pads 27 and 57 are formed in the BI mode detection circuit 20-4 in each of the semiconductor chips and the different voltages are supplied to the bonding pads 27 and 57 in order to melt the section 38 on the node 23 by Joule heat generated by a large current flow. Thereby, it is possible to eliminate the defective semiconductor chip during the wafer test process without using any laser beam. Therefore it is possible to reduce the cost of the semiconductor fabrication and also to reduce the fabrication time period for the semiconductor products.

Sixth Embodiment

Figure 10A:
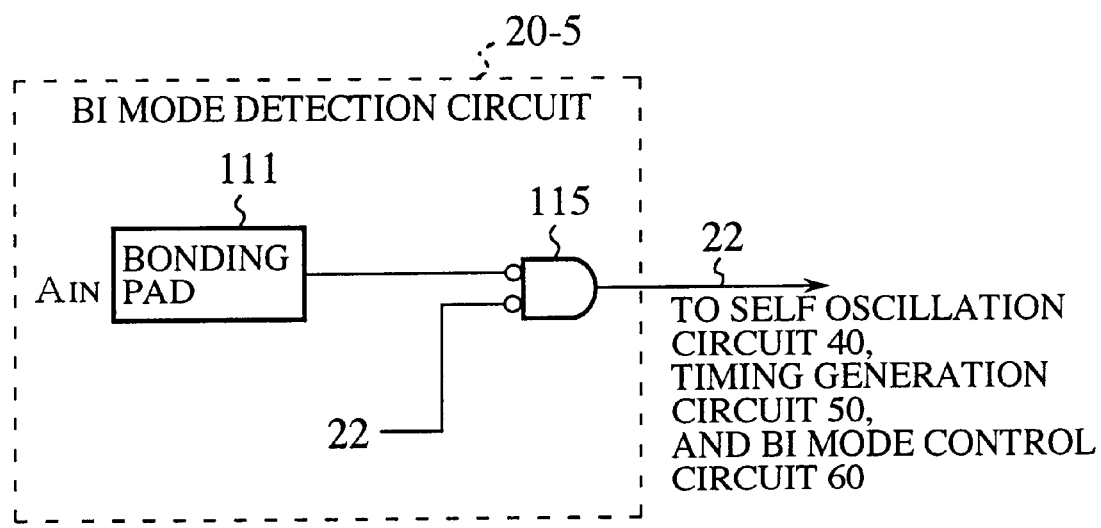
FIGS. 10A and 10B are diagrams showing detailed configurations of a semiconductor chip formed on a wafer as the sixth embodiment according to the present invention.
Figure 10B:
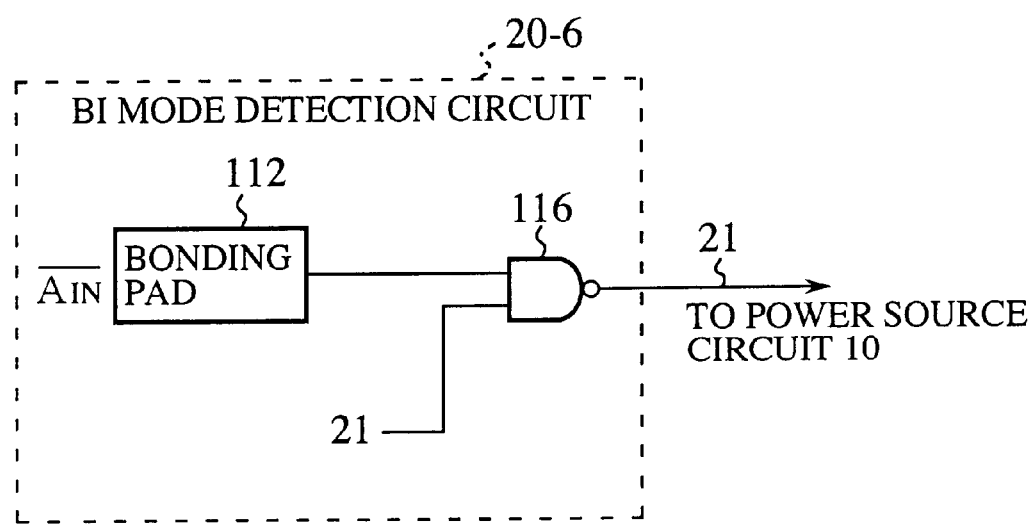

FIGS. 10A and 10B are diagrams showing the detailed configurations of the semiconductor chip formed on the wafer as the sixth embodiment according to the present invention. In FIGS. 10A and 10B, the reference number 20-5 and 20-6 designate BI mode detection circuits. Other components in the semiconductor chip 1 in the wafer of the sixth embodiment shown in FIGS. 10A and 10B are the same of those of the semiconductor chips formed on the wafers as the first to third embodiments, therefore the same reference numbers are used for the same components and the explanation of them is omitted here for brevity.

Next, a description will be given of the operation of the semiconductor chip on the wafer as the sixth embodiment.

During the burn-in mode (the BI mode), the terminals other than the terminal connected to the power supply voltage enter the floating state. When the power enters ON in order to execute the BI mode, there is a possibility to flow a penetrate current because the voltage potential of the gate electrodes of the P channel Tr and the N channel Tr in the inverter circuit (omitted from the FIGS. 10A and 10B) in each of the BI mode detection circuits 20-5 and 20-6 because the voltage potential of the gate electrodes become an intermediate voltage potential between the voltages Vcc and Vss when the power source enters ON. That is, when the voltage potential of the gate electrodes of both the P channel Tr and the N channel Tr in the inverter circuit becomes approximately the voltage of ½ Vcc. This causes both the P channel Tr and the N channel Tr do not enter the OFF state completely and the penetrate current flows from the P channel Tr to the N channel Tr.

In order to avoid this flowing of the penetrate current, as shown in FIGS. 10A and 10B, an input gate comprising a NOR circuit 115 (shown in FIG. 10A) or a NAND circuit 116 (shown in FIG. 10B) is incorporated in each of the BI mode detection circuits 20-5 and 20-6. In this configuration, the BI mode signal 22 or the control signal 21 is transferred to one input and a control signal is inputted into other input connected to a bonding pad 111 or 112 in order to set the NOR circuit 115 and the NAND gate 116 into the OFF state during the BI mode. Thereby, this configuration may prevent to flow the penetrate current during the BI mode.

As described above, according to the sixth embodiment, because the NOR circuit 115 and the NAND circuit 116 are incorporated into the BI mode detection circuits 20-5 and 20-6, respectively, it is possible to prevent flowing of the penetrate current at the input gate during the BI mode, and it is thereby possible to perform the burn-in for the wafer correctly.

Seventh Embodiment

FIG. 11 is a diagram showing the detailed configuration of the plurality of semiconductor chips 1 formed at the wafer peripheral section of the wafer as the seventh embodiment according to the present invention. In FIG. 11, the reference number 131 designates an output driver, the reference number 130 denotes a signal pad for an output signal, the reference number 133 indicates an output signal line formed in the semiconductor chip 1, the reference number 135 designates an output signal line formed on a dicing line 2, the reference number 136 denotes a signal line formed in a region where no semiconductor chip is formed, and the reference number 137 indicates an electrode of the output signal. Other components in the semiconductor chips in the wafer of the seventh embodiment shown in FIG. 11 are the same of those of the semiconductor chips formed on the wafers as the first to sixth embodiments, therefore the same reference numbers are used for the same components and the explanation of them is omitted here for brevity.

Next, a description will be given of the operation of the semiconductor chips 1 on the wafer as the seventh embodiment.

In the wafer of the seventh embodiment, the signal pad 130 is connected to the electrode 137 formed at the peripheral section of the wafer through the output signal line 133 formed on the semiconductor chip 1, the signal line 135 formed on the dicing line 2, and the line 136 formed on the peripheral section of the wafer. During the burn-in mode (the BI mode), the control signal corresponding to the operation of the semiconductor chip is transferred from the output pad 130 to the electrode 137 for the output control signal. During the BI mode, when a probe of an oscilloscope (omitted from FIG. 11) is connected to the electrode 137, operators may detect whether the operation of the semiconductor chips 1 on the wafer is correctly performed in the BI mode through the oscilloscope.

As described above, according to the seventh embodiment, the output signal pad 130 in each of the semiconductor chips 1 formed at the peripheral section of the wafer is connected to the electrode 137 formed at the peripheral section of the wafer through the signal lines 133, 135, and 136, and the control signals corresponding to the operation of the semiconductor chip 1 are output through the output pad 130 to the electrode 137. It is thereby possible to detect whether the semiconductor chip 1 formed on the wafer operates correctly during the burn-in process by using external devices such as the oscilloscope and the like.

Eighth Embodiment

FIG. 12 is a diagram showing the detailed configuration of a plurality of semiconductor chips formed on a wafer as the eighth embodiment according to the present invention. In FIG. 12, the reference number 141 designates a power supply wiring formed on the peripheral section of the wafer. The reference number 143 denotes a power supply wiring formed between adjacent semiconductor chips 1 and crossing the dicing line 2. The reference number 142 indicates a P channel Tr formed between the power supply wiring 141 and the power supply wiring 143 in order to supply/halt the power supply voltage. Other components in the semiconductor chips in the wafer of the eighth embodiment shown in FIG. 12 are the same of those of the semiconductor chips formed on the wafers as the first to seventh embodiments, therefore the same reference numbers are used for the same components and the explanation of them is omitted here for brevity.

Next, a description will be given of the operation of the semiconductor chips on the wafer as the seventh embodiment.

The P channel Tr 142 enters an active state, namely enters ON when receiving the BI mode signal transferred from the BI mode detection circuit 20 (omitted from FIG. 12) in each of the semiconductor chips 1. The BI mode detection circuit 20 measures the voltage level of the power supply wiring 143 in order to detect the BI mode. In addition, as shown in the peripheral section of FIG. 12, the power supply electrode (not shown) is formed, the semiconductor chip 1 formed at the left section of the power supply electrode is connected to the power supply wiring 143, and the semiconductor chip located at the adjacent area is also connected to the power supply wiring 143 crossing the dicing line 2. Furthermore, the right peripheral section of the wafer shown in FIG. 12 has the same configuration shown in the left section of the FIG. 4.

As described above, according to the eight embodiment, the power supply wiring is formed between adjacent semiconductor chips so that it crosses the dicing line 2. therefore it is possible to reduce the width or the area of the dicing line 2 and to increase the number of the semiconductor chips on the wafer, so that it is possible to use the area of the wafer efficiently.

As described above in detail, according to the present invention, the semiconductor device has a plurality of semiconductor chips formed on a wafer divided by dicing lines, and at least one power supply wiring to supply a power supply voltage formed on each of the dicing lines. Each of the semiconductor chips comprises a power supply voltage leading wiring connected to the power supply wiring, a burn-in mode (BI mode) detection circuit connected to the power supply voltage leading wiring for detecting the supply of the power supply voltage to the power supply wiring, and for generating a control signal and a BI mode detection signal indicating to enter the BI mode when the supply of the power source voltage to the power supply wiring, a self oscillation circuit for oscillating a clock signal having a predetermined frequency during the BI mode based on receiving of a BI mode signal, indicating to enter an operation of a burn-in process, transferred from the BI mode detection circuit, a timing generation circuit for receiving the clock signal and for generating a timing clock signal during the BI mode, a BI mode control circuit for receiving the timing clock signal and for transferring internal control signals to a plurality of internal circuits, incorporated in the semiconductor chip, to be executed under the BI mode, and a power supply circuit connected to the power supply voltage leading wiring for supplying the power supply voltage though the power supply wiring into the oscillation circuit, the timing generation circuit, the BI mode control circuit, and the plurality of internal circuits based on the control signal transferred from the BI mode detection circuit. Accordingly it is possible to perform the burn-in process in a wafer level because the required voltages for the burn-in process may be supplied to the various circuits in each of the semiconductor chips on the wafer only by supplying the power supply voltage Vcc and the GND voltage Vss to electrode regions formed on the wafer.

In addition, according to the present invention, a first electrode region through which the power supply voltage Vcc is supplied and a second electrode region through which the GND voltage vss is supplied are formed at a peripheral section of the wafer. The second electrode region is electrically connected to a P– substrate layer through a P+ diffusion layer, and a P– diffusion layer of a N channel transistor in each of the semiconductor chips is electrically connected to the P– substrate layer, and the number of the power supply wiring formed on the dicing line is one and the power supply wiring on the dicing line is connected to the first electrode region. Accordingly, no GND wiring is required on any dicing line. It is thereby possible to reduce the area of the dicing line and also to increase the number of the semiconductor chips on the wafer. This causes to use the wafer efficiently in area.

Further, according to the present invention, each of the plurality of semiconductor chips further comprises an input line, connected to the power supply wiring formed on the dicing line, independently from the power supply voltage leading wiring, to supply the power supply voltage into the BI mode detection circuit, and wherein the power supply voltage is directly supplied from the power supply wiring to the power source circuit through the power supply voltage leading wiring.

Moreover, according to the present invention, the BI mode detection circuit includes a bonding pad for a wafer test formed on a node on the input line, and a reversed voltage, whose voltage level is reversed to a voltage level of the power supply voltage supplied to the power supply wiring, is supplied to the bonding pad during execution of the wafer test.

Furthermore, according to the present invention, the BI mode detection circuit comprises a bonding pad for a wafer test formed on a node on the input line, and a pull down resistance or a pull up resistance is connected to the node on the input line, and a reversed voltage, whose voltage level is reversed to a voltage level of the power supply voltage supplied to the power supply wiring, is supplied to the bonding pad after dicing of the wafer. Accordingly, it is possible to correctly perform the wafer after the wafer test process and semiconductor products after an assembling process under the normal operation mode, not under the BI mode. That is, it is possible to avoid occurrence of an error operation in which the power supply circuit enters the BI mode.

Moreover, according to the present invention, the power source circuit comprises a transistor that enters an ON state when receiving the control signal transferred from the BI mode detection circuit during the BI mode and enters OFF in a mode other than the BI mode, and the power source circuit supplies the power supply voltage to the self oscillation circuit, the timing generation circuit, the BI mode control circuit, and the plurality of internal circuit based on the ON/OFF operation of the transistor. The transistor in the power source circuit is a P channel transistor, the control signal transferred from the BI mode detection circuit is inputted to a gate of the P channel transistor. Or, the transistor in the power source circuit is a N channel transistor, and the input line for supplying the power supply voltage from the power supply wiring to the BI mode detection circuit is directly connected to a gate of the N channel transistor. Accordingly, even if an defective inverter circuit is formed in the BI mode detection circuit during a fabrication process, it is possible to correctly control the operation of the N channel transistor or the P channel transistor incorporated in the power source circuit.

In addition, according to the present invention, the BI mode detection circuit comprises at least two bonding pads, first bonding pad and a second bonding pad, connected to nodes on the input line, wherein a pull down resistance is connected to one of the bonding pads, and voltages of different levels are supplied to both the first bonding pad and the second bonding pad in order to melt the a wiring on the input line between the first bonding pad and the second bonding pad in the BI mode detection circuit in a semiconductor chip as a defective semiconductor chip detected by the wafer test, and wherein non-BI mode signal is supplied to the self oscillation circuit, the timing generation circuit, and the BI mode detection circuit through the bonding pad connected to the pull down resistance. Accordingly, it is possible to detect a defective semiconductor chip during the wafer test process and to repair it by using voltages not using any laser beam. It is possible to reduce the fabrication cost of semiconductor products.

Moreover, according to the present invention, each of the plurality of semiconductor chips further comprises a bonding pad formed on the way of a signal line connected between the BI mode detection circuit and the gate of the transistor in the power source circuit.

Furthermore, according to the present invention, each of the plurality of semiconductor chips further comprises a bonding pad for receiving a control signal, and a NOR circuit or a NAND circuit as an input gate formed in the BI mode detection circuit for inputting the BI mode signal to be transferred to the self oscillation circuit, the timing clock generation circuit and the BI mode control circuit, and wherein the input gate performs a logical operation between the BI mode control signal and the control signal transferred through the bonding pad during the BI mode in order to enter the input gate to an OFF state. Accordingly, it is possible to prevent a penetrate current flowing the input gate during the BI mode, so that the wafer may be burned in correctly.

In addition, according to the present invention, the wafer comprises a bonding pad connected to a signal wiring, through which an output signal from each of the plurality of semiconductor chips is transferred, formed between a peripheral section of the wafer and each of the plurality of semiconductor chips, and wherein the output signal from each of the plurality of semiconductor chips is transferred to external device of the wafer through the signal wiring during the BI mode. Accordingly, an external test device may detect whether the burn-in process is performed in each of the semiconductor chips correctly or not.

Moreover, according to the present invention, the power supply wiring is formed so that the power supply wiring crosses the dicing line. Accordingly, it is possible to reduce the area of the dicing line and the number of the semiconductor chips on the wafer may be increased. That is, it is possible to use the area of the wafer efficiently.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor device comprising:
   a plurality of semiconductor chips formed on a wafer divided by dicing lines; and
   at least one power supply wiring to supply a power supply voltage formed on each of said dicing lines,
   wherein each of said semiconductor chips comprises:
      a power supply voltage leading wiring connected to said power supply wiring;
      a burn-in mode (BI mode) detection circuit connected to said power supply voltage leading wiring for detecting the supply of the power supply voltage to said power supply wiring, and for generating a control signal and a BI mode detection signal indicating to enter said BI mode when the supply of the power source voltage to said power supply wiring;
      a self oscillation circuit for oscillating a clock signal having a predetermined frequency during the BI mode based on receiving of a BI mode signal, indicating to enter an operation of a burn-in process, transferred from said BI mode detection circuit;

a timing generation circuit for receiving said clock signal and for generating a timing clock signal during said BI mode;

a BI mode control circuit for receiving said timing clock signal and for transferring internal control signals to a plurality of internal circuits, incorporated in said semiconductor chip, to be executed under said BI mode; and a power supply circuit connected to said power supply voltage leading wiring for supplying said power supply voltage through said power supply wiring into said oscillation circuit, said timing generation circuit, said BI mode control circuit, and said plurality of internal circuits based on said control signal transferred, from said BI mode detection circuit.

2. A semiconductor device as claimed in claim 1, further comprises a first electrode region through which said power supply voltage is supplied and a second electrode region through which a ground voltage is supplied, both the first electrode region and the second electrode region are formed at a peripheral section of said wafer, wherein said second electrode region is electrically connected to a P− substrate layer through a P+ diffusion layer, and a P− diffusion layer of a N channel transistor in each of said semiconductor chips is electrically connected to said P− substrate layer, and the number of said power supply wiring formed on said dicing line is one and said power supply wiring on said dicing line is connected to said first electrode region.

3. A semiconductor device as claimed in claim 2, each of said plurality of semiconductor chips further comprises an input line, connected to said power supply wiring formed on said dicing line, independently from said power supply voltage leading wiring, to supply said power supply voltage into said BI mode detection circuit, and wherein said power supply voltage is directly supplied from said power supply wiring to said power source circuit through said power supply voltage leading wiring.

4. A semiconductor device as claimed in claim 3, wherein said BI mode detection circuit comprises a bonding pad for a wafer test formed on a node on said input line, and wherein a reversed voltage, whose voltage level is reversed to a voltage level of said power supply voltage supplied to said power supply wiring, is supplied to said bonding pad during execution of said wafer test.

5. A semiconductor device as claimed in claim 3, wherein said BI mode detection circuit comprises a bonding pad for a wafer test formed on a node on said input line, and a pull down resistance or a pull up resistance is connected to said node on said input line, wherein a reversed voltage, whose voltage level is reversed to a voltage level of said power supply voltage supplied to said power supply wiring, is supplied to said bonding pad after dicing of said wafer.

6. A semiconductor device as claimed in claim 3, wherein said BI mode detection circuit comprises at least two bonding pads, first bonding pad and a second bonding pad, connected to nodes on said input line, wherein a pull down resistance is connected to one of said bonding pads, and voltages of different levels are supplied to both said first bonding pad and said second bonding pad in order to melt a wiring on said input line between said first bonding pad and said second bonding pad in said BI mode detection circuit in a semiconductor chip as a defective semiconductor chip detected by said wafer test, and wherein non-BI mode signal is supplied to said self oscillation circuit, said timing generation circuit, and said BI mode detection circuit through said bonding pad connected to said pull down resistance.

7. A semiconductor device as claimed in claim 2, wherein said power source circuit comprises a transistor that enters ON when receiving said control signal transferred from said BI mode detection circuit during said BI mode and enters OFF in a mode other than said BI mode, wherein and said power source circuit supplies said power supply voltage to said self oscillation circuit, said timing generation circuit, said BI mode control circuit, and said plurality of internal circuit based on said the ON/OFF operation of said transistor.

8. A semiconductor device as claimed in claim 1, each of said plurality of semiconductor chips further comprises an input line, connected to said power supply wiring formed on said dicing line, independently from said power supply voltage leading wiring, to supply said power supply voltage into said BI mode detection circuit, and wherein said power supply voltage is directly supplied from said power supply wiring to said power source circuit through said power supply voltage leading wiring.

9. A semiconductor device as claimed in claim 8, wherein said BI mode detection circuit comprises a bonding pad for a wafer test formed on a node on said input line, and wherein a reversed voltage, whose voltage level is reversed to a voltage level of said power supply voltage supplied to said power supply wiring, is supplied to said bonding pad during execution of said wafer test.

10. A semiconductor device as claimed in claim 8, wherein said BI mode detection circuit comprises a bonding pad for a wafer test formed on a node on said input line, and a pull down resistance or a pull up resistance is connected to said node on said input line, wherein a reversed voltage, whose voltage level is reversed to a voltage level of said power supply voltage supplied to said power supply wiring, is supplied to said bonding pad after dicing of said wafer.

11. A semiconductor device as claimed in claim 8, wherein said BI mode detection circuit comprises at least two bonding pads, first bonding pad and a second bonding pad, connected to nodes on said input line, wherein a pull down resistance is connected to one of said bonding pads, and voltages of different levels are supplied to both said first bonding pad and said second bonding pad in order to melt a wiring on said input line between said first bonding pad and said second bonding pad in said BI mode detection circuit in a semiconductor chip as a defective semiconductor chip detected by said wafer test, and wherein non-BI mode signal is supplied to said self oscillation circuit, said timing generation circuit, and said BI mode detection circuit through said bonding pad connected to said pull down resistance.

12. A semiconductor device as claimed in claim 1, wherein said power source circuit comprises a transistor that enters ON when receiving said control signal transferred from said BI mode detection circuit during said BI mode and enters OFF in a mode other than said BI mode, wherein and said power source circuit supplies said power supply voltage to said self oscillation circuit, said timing generation circuit, said BI mode control circuit, and said plurality of internal circuit based on said the ON/OFF operation of said transistor.

13. A semiconductor device as claimed in claim 12, wherein said transistor in said power source circuit is a P channel transistor, wherein said control signal transferred from said BI mode detection circuit is inputted to a gate of said P channel transistor.

14. A semiconductor device as claimed in claim 12, wherein said transistor in said power source circuit is a N channel transistor, and said input line for supplying said power supply voltage from said power supply wiring to said BI mode detection circuit is directly connected to a gate of said N channel transistor.

15. A semiconductor device as claimed in claim 12, each of said plurality of semiconductor chips further comprises a bonding pad formed on the way of a signal line connected between said BI mode detection circuit and said gate of said transistor in said power source circuit.

16. A semiconductor device as claimed in claim 1, each of said plurality of semiconductor chips further comprises: a bonding pad for receiving a control signal; and a NOR circuit or a NAND circuit as an input gate formed in said BI mode detection circuit for inputting said BI mode signal to be transferred to said self oscillation circuit, said timing clock generation circuit and said BI mode control circuit, and wherein said input gate performs a logical operation between said BI mode control signal and said control signal transferred through said bonding pad during said BI mode in order to enter said input gate to an OFF state.

17. A semiconductor device as claimed in claim 1, further comprises a bonding pad connected to a signal wiring, through which an output signal from each of said plurality of semiconductor chips is transferred, formed between a peripheral section of said wafer and each of said plurality of semiconductor chips, and wherein said output signal from each of said plurality of semiconductor chips is transferred to external device of said wafer through said signal wiring during said BI mode.

18. A semiconductor device as claimed in claim 1, wherein said power supply wiring is formed so that said power supply wiring crosses said dicing line.

* * * * *